(12) United States Patent
Wang et al.

(10) Patent No.: US 10,585,252 B2
(45) Date of Patent: Mar. 10, 2020

(54) SCREWLESS HEAT SINK ATTACHMENT

(71) Applicant: FINISAR CORPORATION, Sunnyvale, CA (US)

(72) Inventors: William H. Wang, Pleasanton, CA (US); Joshua John Edward Moore, Ontario (CA)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 16/175,569

(22) Filed: Oct. 30, 2018

(65) Prior Publication Data

US 2019/0121039 A1    Apr. 25, 2019

Related U.S. Application Data

(63) Continuation of application No. 15/224,384, filed on Jul. 29, 2016, now Pat. No. 10,114,183.

(60) Provisional application No. 62/199,590, filed on Jul. 31, 2015.

(51) Int. Cl.
```
H05K 7/20      (2006.01)
G02B 6/42      (2006.01)
H01L 23/40     (2006.01)
```
(52) U.S. Cl.
CPC ........ *G02B 6/4269* (2013.01); *H01L 23/4093* (2013.01); *H01L 23/4006* (2013.01); *H01L 2023/405* (2013.01); *H01L 2023/4062* (2013.01)

(58) Field of Classification Search
CPC ... G02B 6/4269; H05K 7/2049; H01R 13/508
USPC .......................................................... 361/710
See application file for complete search history.

(56) References Cited

U.S. PATENT DOCUMENTS

| | | | | |
|---|---|---|---|---|
| 6,507,489 B1 * | 1/2003 | McGowan | .......... | H01L 23/4093 165/80.3 |
| 6,646,880 B1 * | 11/2003 | Liu | ...................... | H01L 23/4093 165/185 |
| 6,793,517 B2 * | 9/2004 | Neer | .................... | H05K 5/0256 439/372 |

* cited by examiner

*Primary Examiner* — Mukundbhai G Patel
(74) *Attorney, Agent, or Firm* — Maschoff Brennan

(57) ABSTRACT

An optoelectronic system includes an optoelectronic module and a heat sink. The optoelectronic module includes a housing and first and second housing slide locks. The first and second housing slide locks extend outward from opposite sides of the housing. The heat sink includes a heat sink bottom, first and second heat sink legs, and first and second heat sink slide locks. The first and second heat sink legs extend downward from opposite ends of the heat sink bottom. The first and second heat sink slide locks extend inward from the first and second heat sink legs. The heat sink bottom is configured to be in thermal contact with a housing top of the housing. Each of the first and second heat sink slide locks is configured to be respectively disposed beneath the first and second housing slide locks when the heat sink is removably secured to the housing.

19 Claims, 10 Drawing Sheets

SCREWLESS HEAT SINK ATTACHMENT

CROSS-REFERENCE TO RELATED APPLICATION

This application is a continuation of U.S. patent application Ser. No. 15/224,384, filed Jul. 29, 2016 which claims the benefit of and priority to U.S. Provisional App. No. 62/199,590, filed Jul. 31, 2015, both of which are incorporated herein by reference in their entireties.

FIELD

The implementations discussed herein are related to screwless heat sink attachment to optoelectronic modules.

BACKGROUND

Unless otherwise indicated herein, the materials described herein are not prior art to the claims in the present application and are not admitted to be prior art by inclusion in this section.

Some data transmission involves the conversion of optical signals to electrical signals and/or electrical signals to optical signals. In some applications, the conversion occurs at a circuit board. For example, an optical fiber carrying one or more optical signals interfaces with a board-mounted optical assembly (BOA) or other optoelectronic module communicatively coupled to a host device that includes the circuit board. At the BOA, the optical signals may be converted from optical signals to electrical signals using optical receivers. The electrical signals may then be communicated along etched copper traces integrated into the circuit board to a destination. Likewise, electrical signals may be communicated along copper traces to the BOA. At the BOA, the electrical signals may be converted to optical signals by optical transmitters. The optical signals may then be further communicated along optical fiber.

The conversion of the data between optical and electrical domains generates heat. In some circumstances, the heat generated may cause problems with proper function of the components involved in the conversion. Additionally, excess heat may shorten the life or cause failure of components involved in the conversion. Moreover, the heat may leak to surrounding components on the circuit board and cause similar problems.

The subject matter claimed herein is not limited to implementations that solve any disadvantages or that operate only in environments such as those described above. Rather, this background is only provided to illustrate one example technology area where some implementations described herein may be practiced.

SUMMARY OF SOME EXAMPLE IMPLEMENTATIONS

Implementations disclosed herein relate to screwless heat sink attachment to optoelectronic modules.

In an example implementation, an optoelectronic system includes an optoelectronic module and a heat sink. The optoelectronic module includes a housing and first and second housing slide locks. The first and second housing slide locks extend outward from opposite sides of the housing. The heat sink includes a heat sink bottom, first and second heat sink legs, and first and second heat sink slide locks. The first and second heat sink legs extend downward from opposite ends of the heat sink bottom. The first and second heat sink slide locks extend inward from the first and second heat sink legs. The heat sink bottom is configured to be in thermal contact with a housing top of the housing. Each of the first and second heat sink slide locks is configured to be respectively disposed beneath the first and second housing slide locks when the heat sink is removably secured to the housing.

In another example implementation, an optoelectronic module includes a housing and first and second housing slide locks. The housing includes a housing top, a first housing side, and a second housing side, where the first and second housing sides extend downward from opposite ends of the housing top. The first housing slide lock extends outward from the first housing side and is configured to engage a first heat sink slide lock that is configured to be slidably positioned beneath the first housing slide lock to removably secure a heat sink bottom of a heat sink that includes the first heat sink slide lock in thermal contact with the housing top. The second housing slide lock extends outward from the second housing side and is configured to engage a second heat sink slide lock that is configured to be slidably positioned beneath the second housing slide lock to removably secure the heat sink bottom of the heat sink that includes the second heat sink slide lock in thermal contact with the housing top.

In another example implementation, a heat sink includes a heat sink base, multiple fins, first and second heat sink legs, and first and second heat sink slide locks. The heat sink base includes a heat sink bottom and a heat sink top. The fins extend upward from the heat sink top. The first heat sink leg extends downward from a first end of the heat sink bottom. The second heat sink leg extends downward from a second end of the heat sink bottom that is opposite the first end of the heat sink bottom. The first heat sink slide lock extends inward from the first heat sink leg and is configured to engage a first housing slide lock that is configured to be slidably positioned above the first heat sink slide lock to removably secure the heat sink bottom in thermal contact with a housing top of a housing of an optoelectronic module that includes the first housing slide lock. The second heat sink slide lock extends inward from the second heat sink leg and is configured to engage a second housing slide lock that is configured to be slidably positioned above the second heat sink slide lock to removably secure the heat sink bottom in thermal contact with the housing top of the housing of the optoelectronic module that includes the second housing slide lock.

In another example implementation, a retention clip is configured to secure a heat sink to an optoelectronic module. The retention clip includes two cross springs, two front legs, and at least one rear leg. The two front legs extend downward from a front of the two cross springs and each includes a foot that extends rearward. The at least one rear leg extends downward from a rear of the two cross springs.

In another example embodiment, a cantilever retention clip is configured to removably secure a heat sink to an optoelectronic module. The cantilever retention clip includes one or more cross springs, a lip, and a collar. Each of the one or more cross springs is configured to be received between a different pair of fins of the heat sink. The lip extends downward from a first end of the one or more cross springs and with a bottom edge configured to extend below a bottom surface of the heat sink when the heat sink is removably secured to the optoelectronic module using the cantilever retention clip. The collar extends downward from a second end of the one or more cross springs that is opposite the first end. The collar is configured to receive therein a neck of the optoelectronic module that defines a receptacle to receive therein an optical fiber plug.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description, which follows, and, in part, will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description will be rendered by reference to specific implementations thereof, which are illustrated in the appended drawings. It is appreciated that these drawings depict only typical implementations of the invention and are, therefore, not to be considered limiting of its scope. The invention will be described and explained with additional specificity and detail through the use of the accompanying drawings in which.

DETAILED DESCRIPTION OF SOME EXAMPLE IMPLEMENTATIONS

Figure 1:
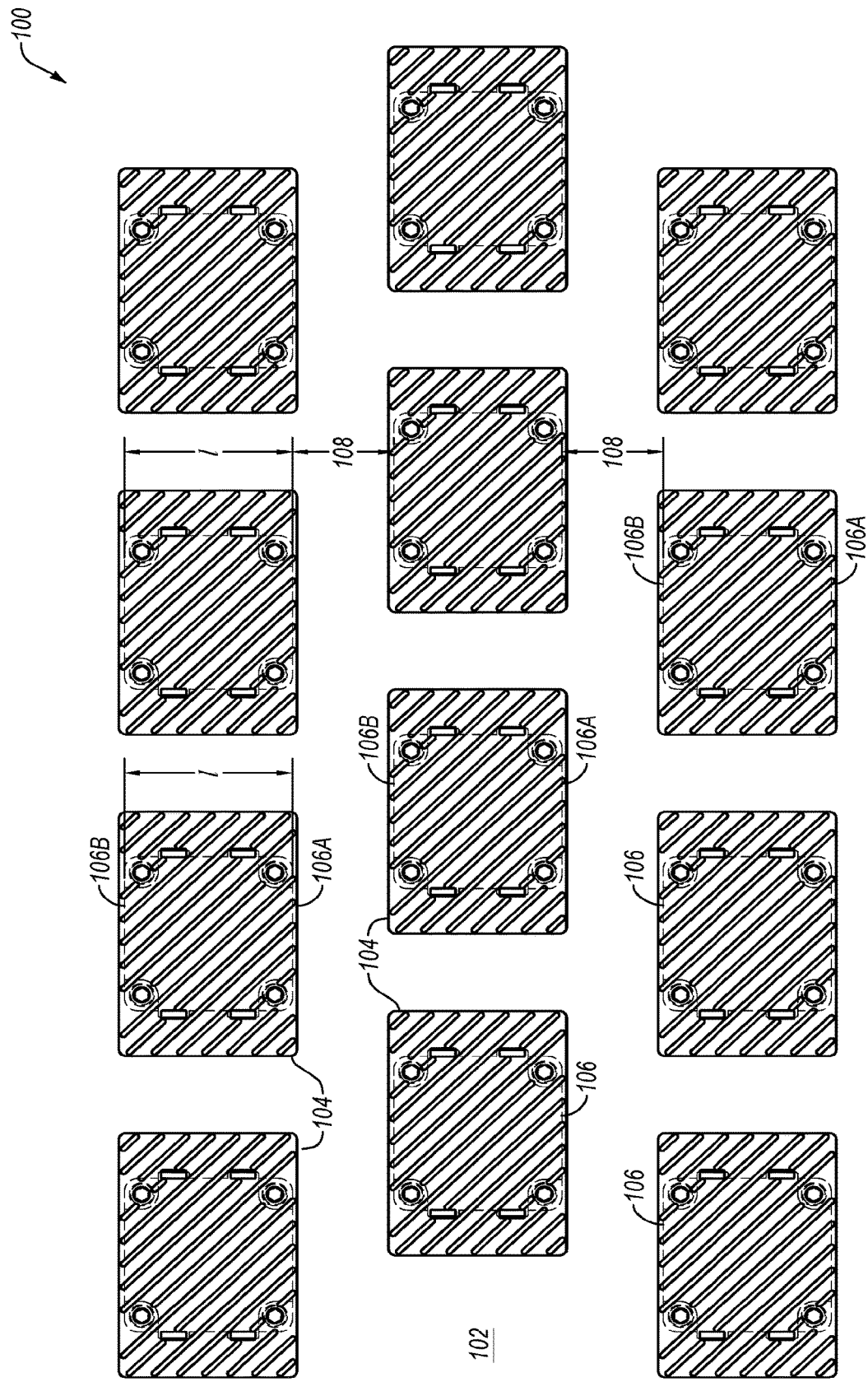
FIG. 1 illustrates an overhead view of an example optoelectronic system.

Some implementations discussed herein are related to screwless heat sink attachment to optoelectronic modules. The optoelectronic modules may include BOAs, pluggable optoelectronic transceivers or transponders, or other suitable optoelectronic modules.

To dissipate heat generated by optoelectronic modules, some optoelectronic systems mount heat sinks to a top or other location of the optoelectronic modules. Some heat sinks are mounted to the optoelectronic modules using screws, clips or other discrete components that are separate from the heat sink and the optoelectronic modules. Screws, clips, and other discrete components used to attach heat sinks to optoelectronic modules may be disadvantageous in that a user may sometimes fumble with the screws, clips, or other discrete components when attaching the heat sink to the optoelectronic module. Alternatively or additionally, the screws, clips, or other discrete components may be inadvertently lost and/or dropped in hard-to-reach places (e.g., within a densely populated host device) during installation.

Other optoelectronic systems may implement a sliding attachment in which a feature or features generally extending a length of a fixed (e.g., board-mounted) optoelectronic module mates with a complementary-shaped feature or features extending a length of the heat sink to attach the heat sink to the optoelectronic module. In such optoelectronic systems, the heat sink may be slid onto the optoelectronic module. While such optoelectronic systems eliminate the use of screws, clips, or other discrete components to attach the heat sink to the optoelectronic module, they require a significant amount of additional space beyond the space occupied by the heat sink in its final installed position for the heat sink to slide onto the optoelectronic module. The additional space may be referred to as an "assembly envelope." The additional space may be about equal to the length of the heat sink and/or the optoelectronic module in the sliding installation direction. Some optoelectronic systems have BOAs or other optoelectronic modules with an end-to-end spacing (or edge-to-edge spacing) between adjacent BOAs that may be less than the length of the BOAs and/or heat sinks, preventing the use of sliding heat sink attachment methods in which the assembly envelope is about equal to the length of the BOAs and/or the heat sinks.

Some implementations disclosed herein may dispense with screws, clips, or other discrete components to simplify the attachment of the heat sink to the optoelectronic module. Instead, the optoelectronic module may have one or more relatively short housing slide locks, while the heat sink may similarly have one or more relatively short heat sink slide locks that are complementary to the housing slide locks. In these and other implementations, an assembly envelope to assemble the heat sink to the optoelectronic module may be relatively short, e.g., as short as a few millimeters (mm) in some implementations, which may be much smaller than the end-to-end or edge-to-edge spacing even in densely populated optoelectronic systems.

Reference will now be made to the drawings to describe various aspects of example implementations of the invention. It is to be understood that the drawings are diagrammatic and schematic representations of such example implementations, and are not limiting of the present invention, nor are they necessarily drawn to scale.

FIG. 1 illustrates an overhead view of an example optoelectronic system 100 (hereinafter "system 100"), arranged in accordance with at least one implementation described herein. The system 100 includes a host printed circuit board (PCB) 102, multiple heat sinks 104, and multiple optoelectronic modules 106. In FIG. 1, only some of the heat sinks 104 and some of the modules 106 are labeled for simplicity. In addition, the heat sinks 104 are illustrated as transparent to make the modules 106 visible beneath the heat sinks 104. In actual implementation, however, the heat sinks 104 may be opaque to visible light.

The host PCB 102 may be included in a host device.

Each of the modules 106 may include a BOA such as a 10 gigabit per second (Gb/s) optical engine, a 25 Gb/s optical engine, or other suitable BOA. In these and other implementations, each of the modules 106 may be mounted to the host PCB 102, e.g., using screws, nuts, and/or other fasteners. More generally, each of the modules 106 may include any board-mounted or pluggable optoelectronic module implemented in operating environments in which heat sinks are secured to the optoelectronic modules, as opposed to being secured to or built into a host receptacle or cage. In some embodiments, the optoelectronic modules may comply with a multi-source agreement (MSA).

Each of the modules 106 is additionally communicatively coupled to the host PCB 102. In these and other implementations, the modules 106 may receive electrical signals from the host PCB 102, which electrical signals are converted by components within the modules 106 to optical signals for transmission over an optical network. Alternatively or additionally, the modules 106 may receive optical signals from the optical network, which optical signals are converted by components within the modules 106 to electrical signals that are provided to the host PCB 102. Some or all of the components of the modules 106 involved in converting electrical signals to optical signals and optical signals to electrical signals, and/or other components of the modules 106, may generate heat. The heat generated by these components may be detrimental to the performance and/or durability of the modules 106 if not dissipated. Accordingly, the heat sinks 104 may be implemented within the system 100 to dissipate the heat.

Each of the heat sinks 104 may be mounted to a top of a corresponding one of the modules 106. During operation, one or more components within each of the modules 106 may generate heat. The heat may be conductively transferred through a housing of each of the modules into a corresponding one of the heat sinks 104. The heat may be dissipated to a surrounding environment within the system 100 by fins or other structural features of each of the heat sinks 104.

Although not illustrated in FIG. 1, the system 100 further includes one or more optical fibers that plug into a receptacle on a fiber side 106A of each of the modules 106. Only some of the fiber sides 106A are labeled in FIG. 1 for simplicity. Each of the modules 106 additionally includes a non-fiber side 106B opposite the fiber side 106A. Only some of the non-fiber sides 106B are labeled in FIG. 1 for simplicity.

The modules 106 may be arranged on the host PCB 102 with a generally uniform spacing between adjacent modules 106. For example, the modules 106 may have a generally uniform end-to-end spacing 108 from the non-fiber side 106B of each of the modules 106 to the fiber side 106A of one or more adjacent ones of the modules 106. The end-to-end spacings 108 may determine a maximum permitted assembly envelope to attach each of the heat sinks 104 to a corresponding one of the modules 106 and/or to remove each of the heat sinks 104 from the corresponding one of the modules 106. It can be seen from FIG. 1 that each of the end-to-end spacings 108 is less than a length 1 of each of the modules 106 such that sliding heat sink attachment methods with an assembly envelope approximately equal to a length of a module will not work in the system 100 of FIG. 1.

Figure 2A:
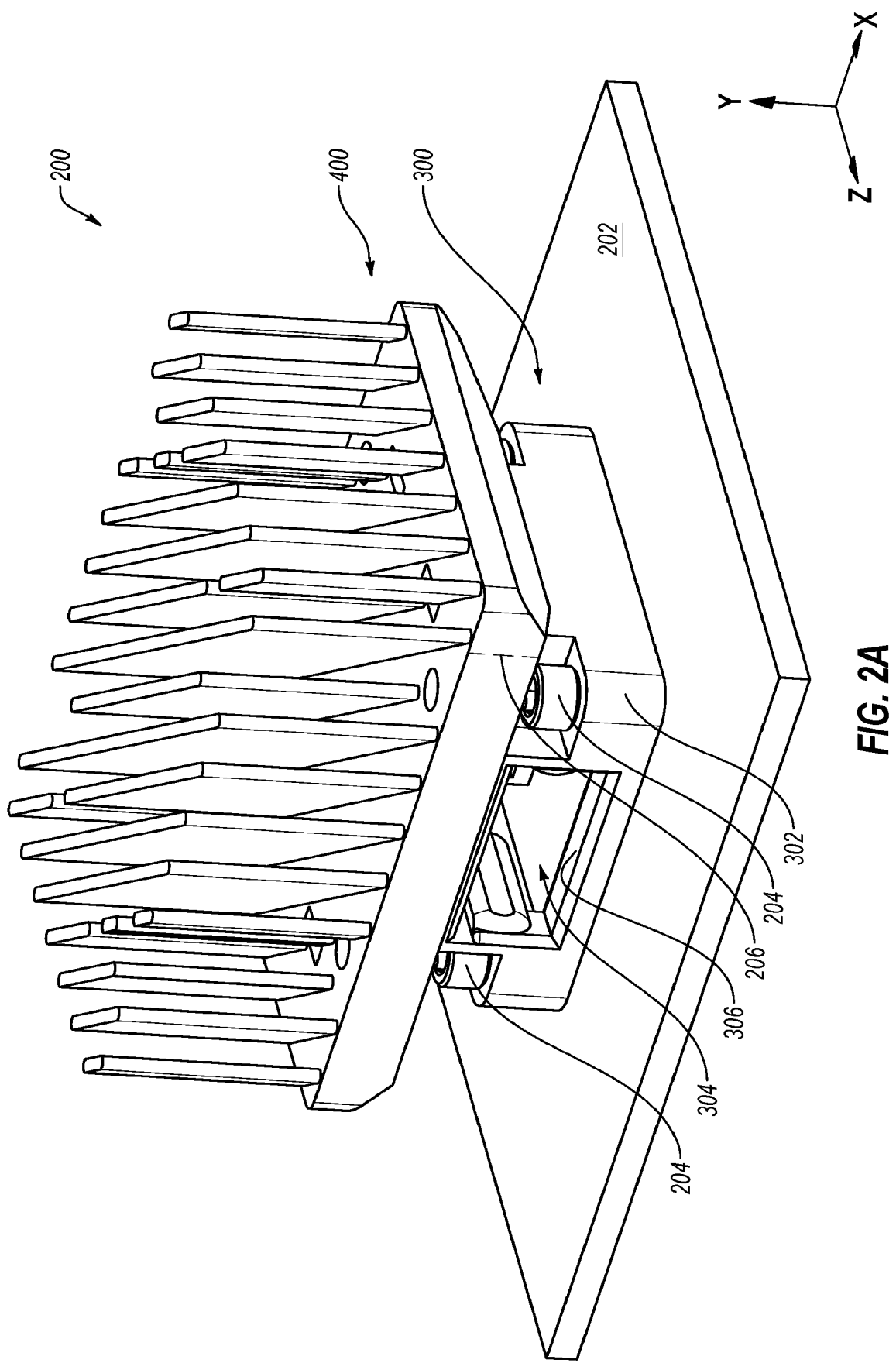
FIGS. 2A and 2B illustrate a top perspective view and an exploded top perspective view of another example optoelectronic system.
Figure 2B:
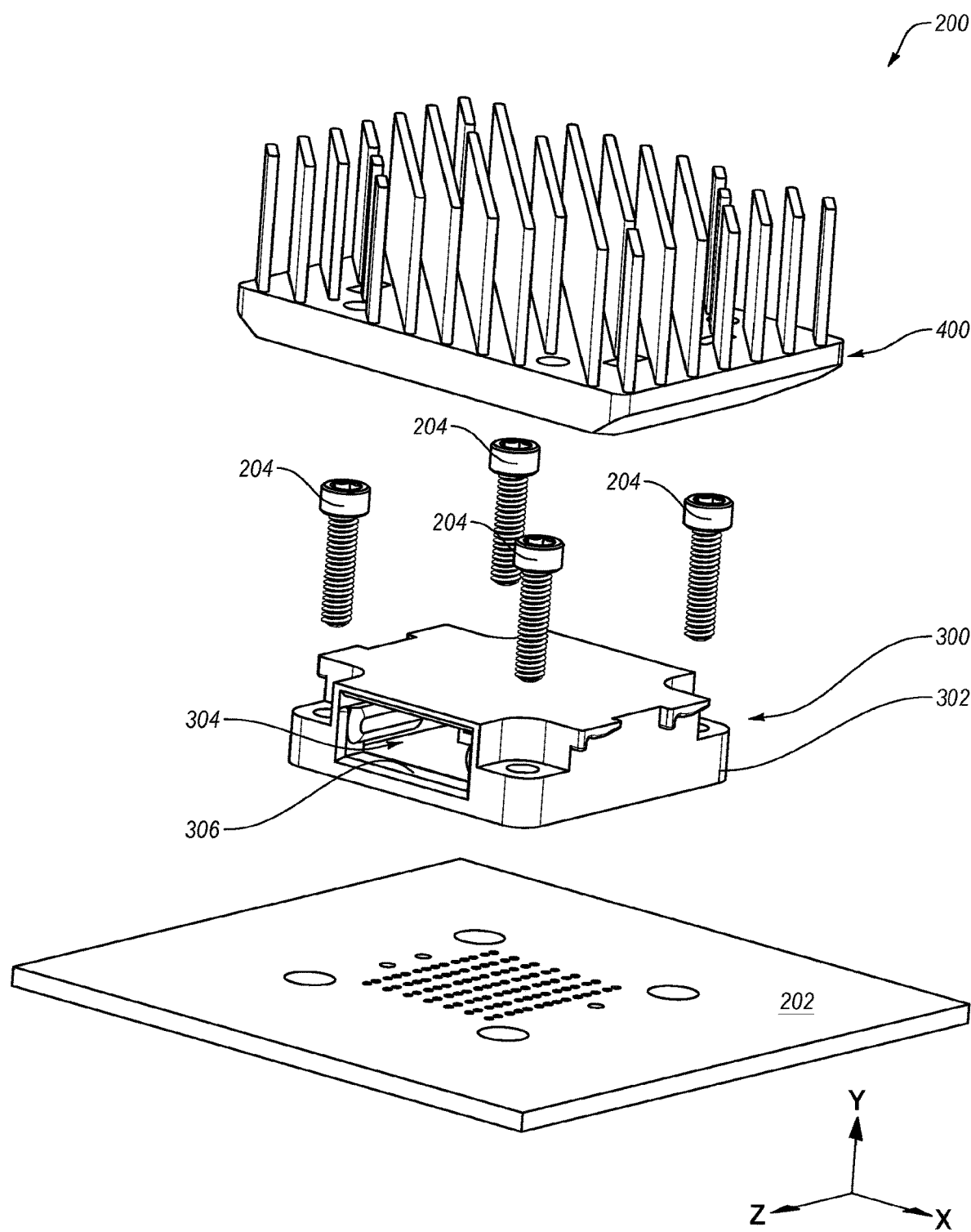

FIGS. 2A and 2B illustrate a top perspective view and an exploded top perspective view of another example optoelectronic system 200 (hereinafter "system 200"), arranged in accordance with at least one implementation described herein. The system 200 is an implementation of the system 100 of FIG. 1. The system 200 includes at least an optoelectronic module 300 (hereinafter "module 300") and a heat sink 400. The system 200 may additionally include a host PCB 202 and one or more screws 204 or other fasteners to secure the module 300 to the host PCB 202. The module 300, the heat sink 400, and the host PCB 202 are implementations of the module 106, the heat sink 104, and the host PCB 102 of FIG. 1 and the description of the module 106, the heat sink 104, and the host PCB 102 applies to the module 300, the heat sink 400, and the host PCB 202.

The module 300 includes a housing 302 that defines an internal cavity 304. The module 300 also includes one or more components (not shown) used in optical and/or electrical communication (e.g., a lens, a laser or other optical transmitter, a PIN photodiode or other optical receiver, monitor photodiodes, etc.) that are positioned inside the housing 302 within the internal cavity 304. The module 300 additionally includes a receptacle 306 disposed on a fiber side of the module 300 that is configured to receive one or more optical fibers. An end of each of the one or more optical fibers may have attached thereto a fiber connector, such as an MT connector, that is configured to be received within the receptacle 306 and to optically couple the end of each of the one or more optical fibers to one or more components within the module 300, such as to an optical transmitter and/or an optical receiver positioned within the internal cavity 304.

Elements different than and/or in addition to those illustrated in FIGS. 2A and 2B may be included in the system 200. For example, although not illustrated in FIGS. 2A and 2B, the system 200 may further include one or more of a thermal pad, thermal grease, thermal gel, thermal tape, thermal paste or other thermally conductive material or substance disposed between a heat sink bottom of the heat sink 400 and a housing top of the housing 302 of the module 300. Such thermally conductive material or substance disposed between the heat sink 400 and the housing 302 may enhance conductive transfer of heat from the module 300 to the heat sink 400.

FIGS. 2A and 2B additionally include an arbitrarily defined xyz coordinate system. The xyz coordinate system is used throughout FIGS. 2A-8 to provide a consistent frame of reference and includes three mutually orthogonal axes, including an x axis, a y axis, and a z axis. In general, the z axis is parallel to a direction in which an optical fiber and/or fiber connector is plugged into and/or removed from the receptacle 306. The z axis is also parallel to a sliding installation direction in which the heat sink 400 may be translated relative to the module 300 to attach the heat sink 400 to or remove the heat sink 400 from the module 300. Terms such as forward, backward, front, back, or the like are used herein to refer to relative orientation and/or motion in a direction parallel to the z axis unless context dictates otherwise. The y axis is parallel to a vertical direction. Terms such as up, down, above, below, over, under, or the like are used herein to refer to relative orientation and/or motion in a direction parallel to the y axis unless context dictates otherwise. The x axis is parallel to a lateral direction. Terms such as left, right, sideways, laterally, or the like are used herein to refer to relative orientation and/or motion in a direction parallel to the x axis unless context dictates otherwise.

FIG. 2A further includes a reference line 206 in a front end of the heat sink 400. A cutting plane that is parallel to the y-z plane and within which the reference line 206 lies is discussed in the context of FIG. 5.

Figure 3A:
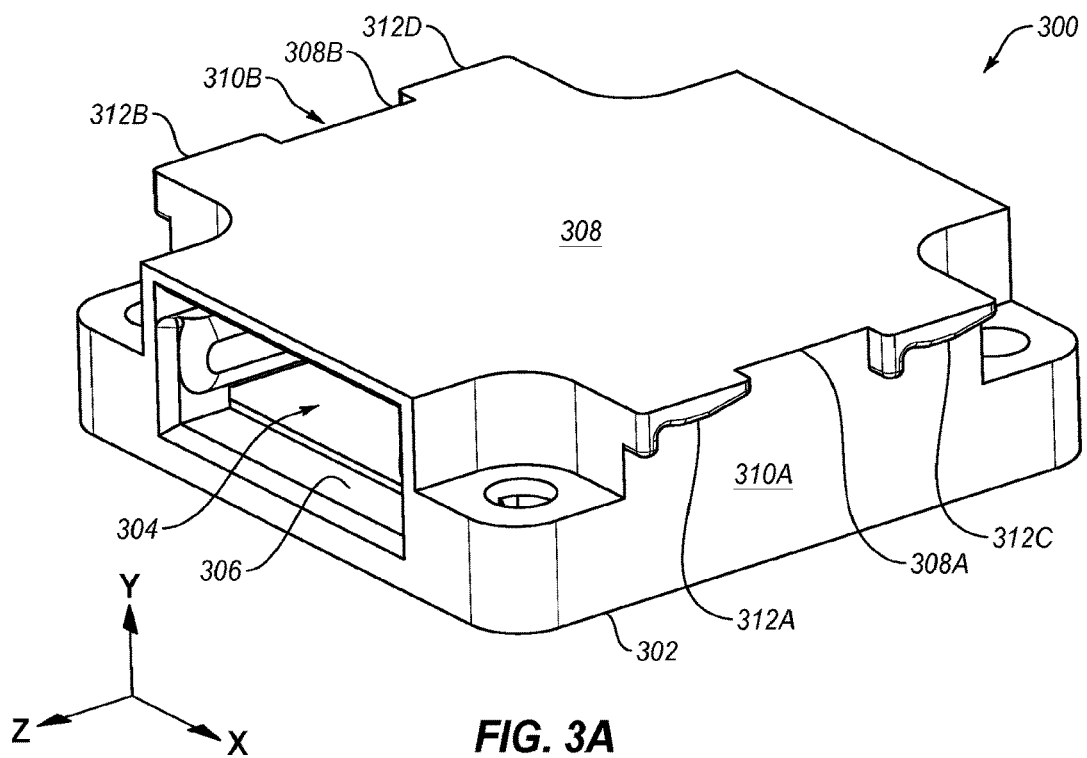
FIG. 3A includes a top perspective view of an optoelectronic module that may be included in the optoelectronic system of FIGS. 2A and 2B.

FIG. 3A includes a top perspective view of the module 300, arranged in accordance with at least one implementation described herein. As illustrated in FIG. 3A, the housing 302 of the module 300 includes a housing top 308, a first housing side 310A, and a second housing side 310B (which is not visible in the view of FIG. 3A). In the present disclosure, ordinal numbers such as first, second, third, fourth, etc. are used herein as adjectives to distinguish between otherwise similarly named components. Such ordinal numbers do not denote a preference or order of the components with which the terms are used unless context dictates otherwise.

Returning to the discussion of FIG. 3A, the first and second housing sides 310A and 310B may be generically referred to herein as "housing side 310" or "housing sides 310." The housing sides 310 extend downward from opposite ends (or edges) 308A, 308B of the housing top 308.

The module 300 additionally includes one or more housing slide locks. In the example of FIG. 3A, the module 300 includes four housing slide locks, including a first housing slide lock 312A, a second housing slide lock 312B, a third housing slide lock 312C, and a fourth housing slide lock 312D (collectively "housing slide locks 312"). The first and third housing slide locks 312A and 312C extend laterally outward from the first housing side 310A, e.g., they extend in the positive x direction. The second and fourth housing slide locks 312B and 312D extend laterally outward from the second housing side 310B, e.g., they extend in the negative x direction. A top of each of the housing slide locks 312 may be flush with the housing top 308 in some implementations. The heat sink 400 may be removably secured to the housing 302 by engagement between one or more housing slide locks, such as the housing slide locks 312, and one or more corresponding heat sink slide locks included in the heat sink 400 and without any screws or bolts or other discrete components.

In the illustrated implementation, the first and second housing slide locks 312A and 312B are located at a common first position in the z direction (or sliding installation direction), e.g., they have the same z axis coordinate. The third and fourth housing slide locks 312C and 312D are similarly located at a common second position in the z direction, where the common second position is spaced apart from the common first position in the z direction. In other implementations, the first and second housing slide locks 312A and 312B may be located at different positions in the z direction and/or the third and fourth housing slide locks 312C and 312D may be located at different positions in the z direction.

Figure 3B:
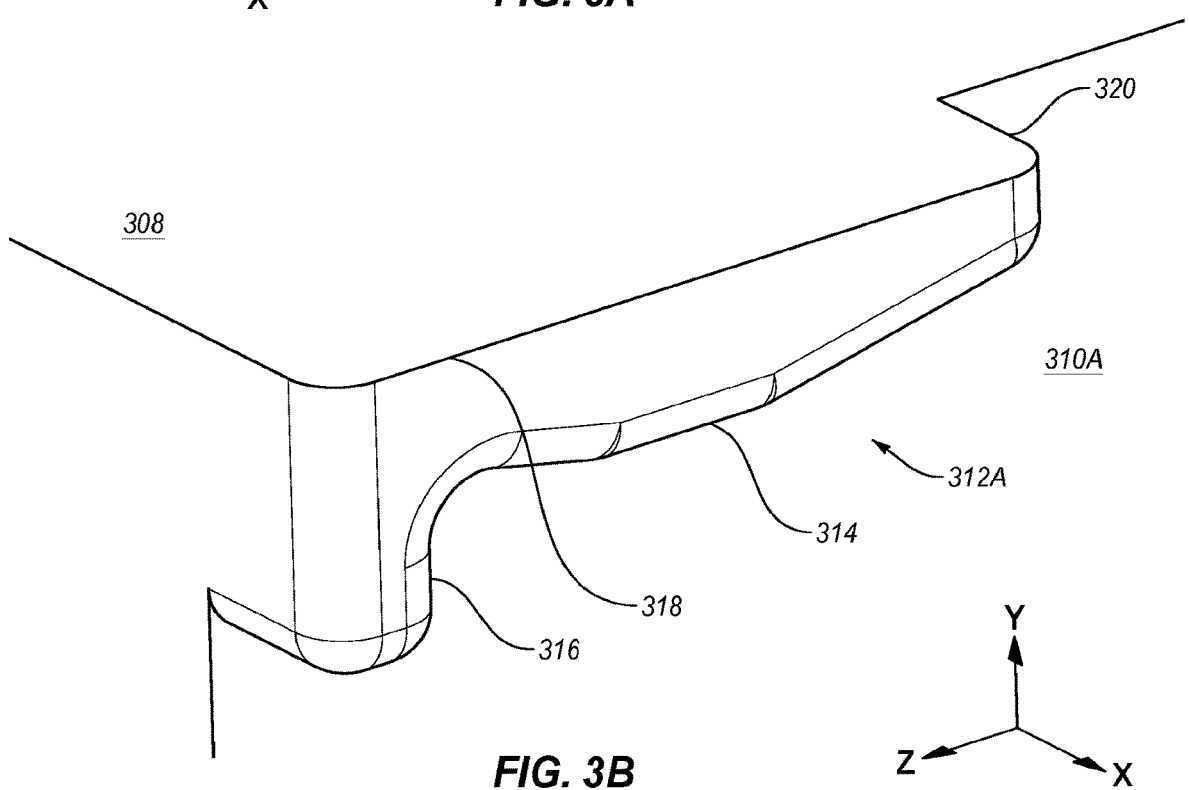
FIG. 3B includes a detail top perspective view of a first housing slide lock that may be included in the optoelectronic module of FIG. 3A.

FIG. 3B includes a detail top perspective view of the first housing slide lock 312A, arranged in accordance with at least one implementation described herein. The first housing slide lock 312A is generally representative of all of the housing slide locks 312 and each of the housing slide locks 312 may have the same or similar features as the first housing slide lock 312A. As illustrated in FIG. 3B, the first housing slide lock 312A includes a bottom 314 with a contour. Each of the second, third, and fourth housing slide locks 312B-312D may similarly include a bottom with a corresponding contour. The housing slide locks 312 may include the same contour or different contours. In FIGS. 3A and 3B, the first and third housing slide locks 312A and 312C are illustrated as having convex contours on the respective bottom 314 of the first and third housing slide locks 312A and 312C, and the second and fourth housing slide locks 312B and 312D may similarly have convex contours on their respective bottoms 314. Alternatively or additionally, one or more of the housing slide locks 312 may have concave contours or some other contour.

As illustrated in FIG. 3B, the first housing slide lock 312A further includes a housing hard stop 316 that extends outward from the first housing side 310A and downward from a trailing end 318 of the first housing slide lock 312A. The trailing end 318 is opposite a leading end 320 of the first housing slide lock 312A. During installation of the heat sink 400 on the module 300, the leading end 320 is the first of the trailing and leading ends 318 and 320 passed by a leading end of the first heat sink slide lock, and the leading end of the first heat sink slide lock is stopped at the trailing end 318 by the housing hard stop 316. Each of the second, third, and fourth housing slide locks 312B-312D may similarly include housing hard stops 316, trailing ends 318, and leading ends 320 that interact with corresponding heat sink slide locks of the heat sink 400 in a similar manner. The housing hard stops 316 of the housing slide locks 312 may be configured to prevent leading ends of the heat sink slide locks from exceeding, in a sliding installation direction, the housing hard stops 316.

In some implementations, a length in the z direction of each of the housing slide locks 312 may be about 4.50 mm and/or a distance in the z direction from the leading end 320 to the hard stop 316 may be about 3.75 mm. As used herein, the term "about" as applied to a value may include a range of the stated value plus or minus ten percent. The length in the z direction of each of the housing slide locks 312, or more particularly, the distance in the z direction from the leading end 320 to the hard stop 316, may determine a minimum possible assembly envelope for the heat sink 400. For example, the assembly envelope may be equal to the distance in the z direction from the leading end 320 to the hard stop 316. Accordingly, in some implementations, the dimensions of each of the housing slide locks 312 may be selected to achieve a desired assembly envelope.

As illustrated in FIGS. 3A and 3B, the housing hard stops 316/trailing ends 318 are located at the front of the housing slide locks 312. The locations of the housing hard stops 316 at the front of the housing slide locks 312 may prevent the heat sink 400 from being installed from a front of the module 300, instead confining the heat sink 400 to being installed from a back of the module 300. Insofar as one or more optical fibers may be coupled to the module 300 through the receptacle 306 at the front of the module 300, this configuration may protect the one or more optical fibers from being inadvertently damaged. In particular, since the heat sink 400 may be confined to installation from the back of the module 300 and the one or more optical fibers extend from the front of the module 300, the heat sink 400 may be less likely to inadvertently contact and/or damage the one or more optical fibers during installation.

In FIGS. 3A and 3B, each of the housing slide locks 312 is integrally formed with the housing 302 in their entirety. In other implementations, each of the housing slide locks 312 may include a portion integrally formed with the housing from the same material as the housing, e.g., being formed from a common mold. Each of the housing slide locks 312 may additionally include a sheet metal spring attached to a bottom of the portion, where the bottom of the corresponding housing slide lock 312 includes a bottom of the sheet metal spring. As will be described in more detail below, the bottom of each of the housing slide locks 312 (whether the bottom of the integrally formed housing slide locks 312 of FIGS. 3A and 3B or the bottom of a sheet metal spring included as part of each of the housing slide locks) engages a top of each corresponding heat sink slide lock.

Figure 4A:
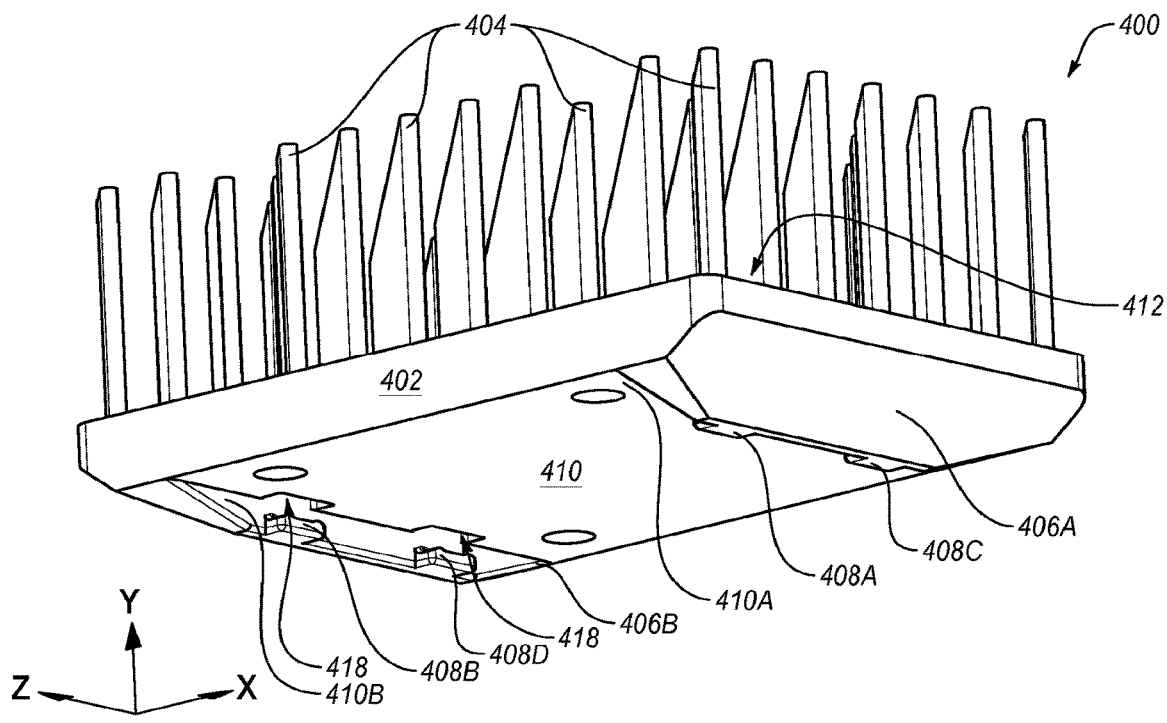
FIG. 4A includes a bottom perspective view of a heat sink that may be included in the optoelectronic system of FIGS. 2A and 2B.

FIG. 4A includes a bottom perspective view of the heat sink 400, arranged in accordance with at least some implementations described herein. As illustrated in FIG. 4A, the heat sink 400 includes a heat sink base 402, multiple heat sink fins 404 (only some of which are labeled for simplicity), first and second heat sink legs 406A-406B (collectively "heat sink legs 406"), and one or more heat sink slide locks, including first through fourth heat sink slide locks 408A-408D (collectively "heat sink slide locks 408") in the example of FIG. 4.

The heat sink base 402 includes a heat sink bottom 410 and a heat sink top 412 (not visible in FIG. 4A).

The heat sink fins 404 extend upward from the heat sink top 412 and are only one example of a heat-dissipating element that may be included in the heat sink 400. More generally, the heat sink 400 may include one or more heat-dissipating elements such as fins, round pins, square pins, or other heat-dissipating elements with any suitable alignment and orientation that may depend on, e.g., cooling airflow in a host system. A height of the heat sink fins 404 or other heat-dissipating elements of the heat sink 400 may be adjusted shorter or taller than illustrated in the Figures depending on cooling requirements.

The first heat sink leg 406A extends downward from a first end (or edge) 410A of the heat sink bottom 410. The second heat sink leg 406B extends downward from a second end (or edge) 410B of the heat sink bottom 410 that is opposite the first end 410A. A lateral distance (e.g., a distance in the x direction) between inner surfaces of the heat sink legs 406 may be greater than or equal to a lateral distance between outer surfaces of the first and second housing slide locks 312A, 312B and/or between outer surfaces of the third and fourth housing slide locks 312C, 312D so that the heat sink 400 may accommodate the top of the housing 308 that includes the housing slide locks 312 between the heat sink legs 406.

The first and third heat sink slide locks 408A and 408C extend laterally inward from the first heat sink leg 406A, e.g., they extend in the negative x direction. The second and fourth heat sink slide locks 408B and 408D extend laterally inward from the second heat sink leg 406B, e.g., they extend in the positive x direction.

In the illustrated implementation, the first and second heat sink slide locks 408A and 408B are located at a common first position in the z direction (or sliding installation direction), e.g., they have the same z axis coordinate. The third and fourth heat sink slide locks 408C and 408D are similarly located at a common second position in the z direction, where the common second position is spaced apart from the common first position in the z direction. In other implementations, the first and second heat sink slide locks 408A and 408B may be located at different positions in the z direction and/or the third and fourth heat sink slide locks 408C and 408D may be located at different positions in the z direction.

Figure 4B:
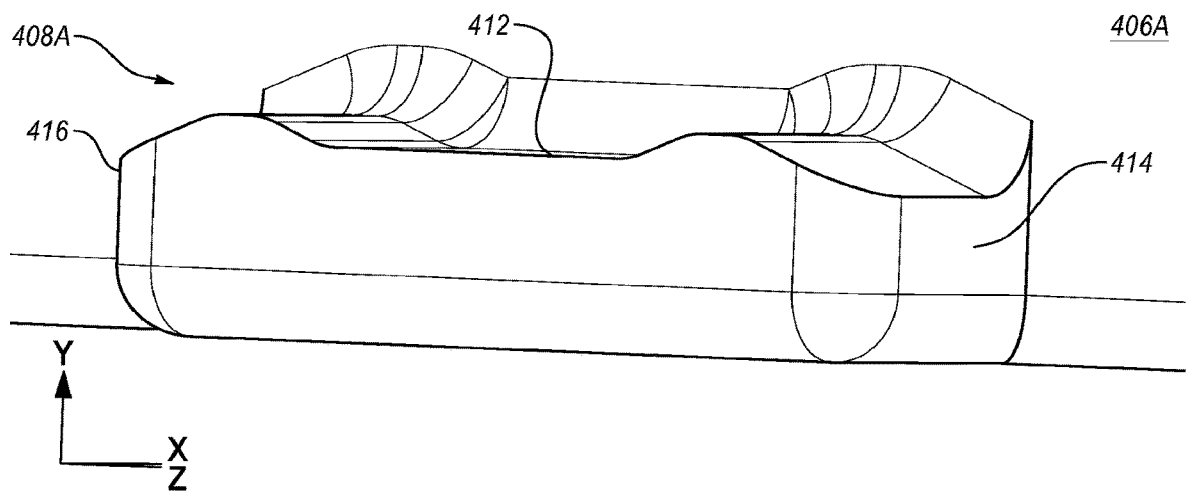
FIG. 4B includes a detail top perspective view of a first heat sink slide lock that may be included in the heat sink of FIG. 4A.

FIG. 4B includes a detail top perspective view of the first heat sink slide lock 408A, arranged in accordance with at least one implementation described herein. The first heat sink slide lock 408A is generally representative of all of the heat sink slide locks 408 and each of the heat sink slide locks 408 may have the same or similar features as the first heat sink slide lock 408A. As illustrated in FIG. 4B, the first heat sink slide lock 408A includes a top 412 with a contour. Each of the second, third, and fourth heat sink slide locks 408 may similarly include a top 412 with a corresponding contour. The heat sink slide locks 408 may include the same contour or different contours. In FIGS. 4A and 4B, the first, second, and fourth housing slide locks 408A, 408B, and 408D are illustrated as having concave contours on the respective top 412 of the first, second, and fourth heat sink slide locks 408A, 408B, and 408D, and the third heat sink slide lock 408C may similarly have a concave contour on its top 412. Alternatively or additionally, one or more of the heat sink slide locks 408 may have convex contours or some other contour.

As illustrated in FIG. 4B, the first heat sink slide lock 408A further includes a leading end 414 and a trailing end 416. These will be described in more detail below.

With combined reference to FIGS. 3A-4B, each of the housing slide locks 312 includes a bottom 314 with a contour that is complementary to a contour of a top 412 of a corresponding one of the heat sink slide locks 408. In other embodiments, contours of the bottoms 314 of the housing slide locks 312 are not complementary to contours of the tops 412 of the heat sink slide locks 408. Each of the heat sink slide locks 408 is configured to be slidably positioned beneath a different corresponding one of the housing slide locks 312 to removably secure the heat sink bottom 410 in thermal contact with the housing top 308. Relative positioning between the housing slide locks 312 and the heat sink slide locks 408 is described in more detail with respect to FIGS. 5-6B. Alternatively or additionally, each of the housing slide locks 312 is configured to be slidably positioned above a different corresponding one of the heat sink slide locks 408 to removably secure the heat sink bottom 410 in thermal contact with the housing top 308.

FIG. 4A further illustrates windows 418 that may be formed through the heat sink base 402. The windows 418 are illustrated above the second and fourth heat sink slide locks 408B and 408D. Windows 418 may also be positioned above the first and third heat sink slide locks 408A and 408C. The windows 418 above the heat sink slide locks 408 may simplify tooling for mass production of heat sinks like the heat sink 400.

Figure 5:
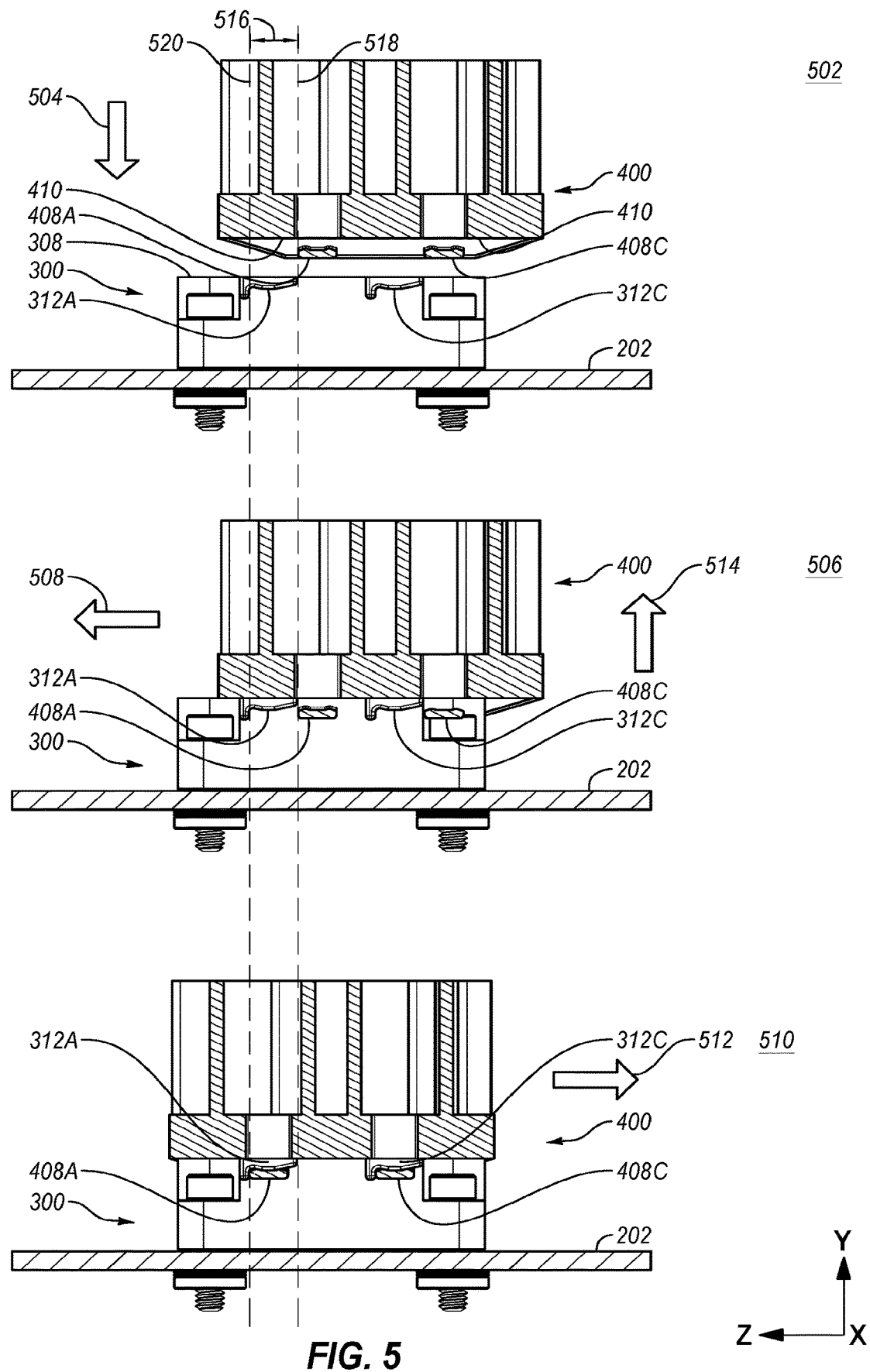
FIG. 5 illustrates an example installation and/or removal process of the heat sink of FIGS. 2A, 2B, and 4A.

FIG. 5 illustrates an example installation and/or removal process 500 of the heat sink 400, arranged in accordance with at least one implementation described herein. FIG. 5 includes a cross-section through the heat sink 400 and the host PCB 202. The cross-section has been taken along the cutting plane defined by the reference line 206 of FIG. 2A. The cutting plane does not pass through the module 300 or the screws 204 such that neither the module 300 or the screws 204 are illustrated in cross-section in FIG. 5. While only the first and third heat sink slide locks 408A and 408C and the first and third housing slide locks 312A and 312C are visible in FIG. 5, the discussion of FIG. 5 will include reference to the second and fourth heat sink slide locks 408B and 408D as well as the second and fourth housing slide locks 312B and 312D.

Installation of the heat sink 400 on the module 300 will now be described. Installation may generally begin as illustrated at stage 502 by positioning the heat sink 400 with respect to the module 300 such that (1) the heat sink 400 is above the module 300, (2) the first-fourth heat sink slide locks 408A-408D are respectively aligned laterally in the x direction with the first-fourth housing slide locks 312A-312D, and (3) the first-fourth heat sink slide locks 408A-408D are positioned in the z direction just behind, respectively, the first-fourth housing slide locks 312A-312D.

From the position depicted at stage 502, the heat sink 400 may be lowered onto the module 300 as generally denoted by a downward-directed arrow 504. The heat sink 400 may be lowered until the heat sink bottom 410 is resting on the housing top 308 as illustrated at stage 506.

In the position illustrated at stage 506, the first-fourth heat sink slide locks 408A-408D are respectively beneath the first-fourth housing slide locks 312A-312D in the y direction, while still being laterally aligned with the first-fourth housing slide locks 312A-312D in the x direction and positioned just behind the first-fourth housing slide locks in the z direction.

From the position depicted at stage 506, the heat sink 400 may be slid forward, e.g., in the positive z direction or sliding installation direction, with respect to the module 300 as generally denoted by a positive z-directed arrow 508. The heat sink 400 may be slid forward until the heat sink slide locks 408 fully engage the housing slide locks 312 and/or until leading ends 414 (FIG. 4B) of the heat sink slide locks 408 are stopped by housing hard stops 316 (FIG. 3B) at trailing ends 318 (FIG. 3B) of the housing slide locks 312 as illustrated at stage 510. In these and other implementations, contours of tops 412 (FIG. 4B) of the heat sink slide locks 408 may be complementary to contours of bottoms 314 of the housing slide locks 312 to provide tactile feedback when the heat sink slide locks 408 fully engage the housing slide locks 312 and/or to bias the heat sink 400 at a particular position with respect to the module 300.

A final installed position of the heat sink 400 with respect to the module 300 is illustrated at stage 510. In the final installed position at stage 510, the first-fourth heat sink slide locks 408A-408D are respectively aligned in the z direction with the first-fourth housing slide locks 312A-312D. That is, the first-fourth heat sink slide locks 408A-408D respectively have the same z-axis positions as the first-fourth housing slide locks 312A-312D. At the same time, the first-fourth heat sink slide locks 408A-408D are still respectively beneath the first-fourth housing slide locks 312A-312D in the y direction and are still laterally aligned with the first-fourth housing slide locks 312A-312D in the x direction.

Removal of the heat sink 400 from the module 300 will now be described. Removal of the heat sink 400 may generally begin from the final installed position illustrated at stage 510. From this position, the heat sink 400 may be slid backward, e.g., in the negative z direction, with respect to the module 300 as generally denoted by a negative z-directed arrow 512. The heat sink 400 may be slid backward at least until the leading ends 414 (FIG. 4B) of the heat sink slide locks 408 clear the leading ends 320 (FIG. 3B) of the housing slide locks 312 as illustrated at stage 506.

From the position illustrated at stage 506, the heat sink 400 may be moved upward, e.g., in the positive y direction, and away from the module 300 as generally denoted by an upward-directed arrow 514. The heat sink 400 may be moved upward at least until the heat sink slide locks 408 clear the housing slide locks in the y direction. For instance, the heat sink 400 may be moved upward to the position illustrated at stage 502. At this point, removal of the heat sink 400 from the module 300 is complete.

FIG. 5 additionally illustrates an assembly envelope 516 of the heat sink 400 that may be determined relative to first and second reference lines 518 and 520. The first reference line 518 is aligned in the z direction with the leading end 414 (FIG. 4B) of the first heat sink slide lock 408A in stages 502 and 506 of FIG. 5. The second reference line 520 is aligned in the z direction with the leading end 414 (FIG. 4B) of the first heat sink slide lock 408A in stage 510 of FIG. 5. In stages 502 and 506, the heat sink 400 is positioned in the z direction so that the heat sink slide locks 408 will just clear the housing slide locks 312 as the heat sink 400 is lowered onto the module 300. In stage 510, the heat sink 400 is in the final installed position with respect to the module 300. The assembly envelope 516 may be defined as a minimum translation distance in the z direction (or the sliding installation direction) of the heat sink 400 to removably secure the heat sink 400 to the module 300, which in this case is equal to the distance between the first reference line 518 and the second reference line 520.

In some implementations, the module 300 may have a length in the z direction of about 25 mm and the assembly envelope 516 may be less than about 20 mm. Alternatively or additionally, the assembly envelope 516 may be less than about 10 mm. Alternatively or additionally, the assembly envelope may be about 6 mm, or even less than 5 mm. More generally, the assembly envelope 516 may be less than the length of the module 300 in the z direction. For example, if the module 300 has a length in the z direction of 100 mm or 15 mm, the assembly envelope 516 may be less than 100 mm or 15 mm, respectively.

Figure 6A:
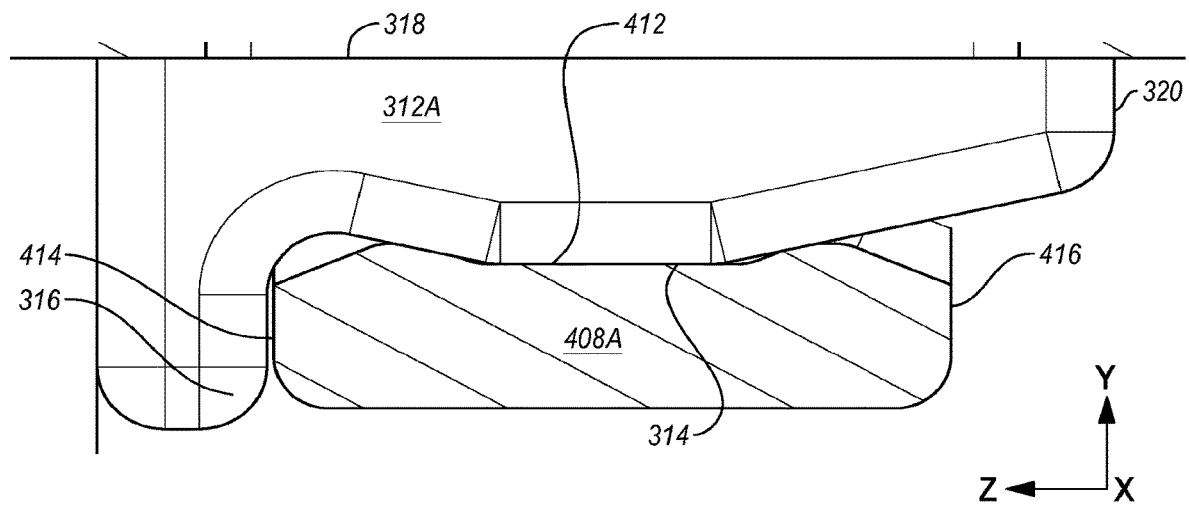
FIG. 6A is a detail cross-sectional side view of the first heat sink slide lock and the first housing slide lock of FIGS. 2A-4B.

FIG. 6A is a detail cross-sectional side view of the first heat sink slide lock 408A and the first housing slide lock 312A, arranged in accordance with at least one implementation described herein. The cross-section of FIG. 6A has been taken along the cutting plane defined by the reference line 206 of FIG. 2A with the heat sink 400 installed on the module 300 as in stage 510 of FIG. 5. In FIG. 6A, the cutting plane does not pass through the first housing slide lock 312A.

During installation of the heat sink 400, the first heat sink slide lock 408A is positioned in back of the first housing slide lock 312A in the z direction and lower than the first housing slide lock 312A in the y direction, while generally being aligned with the first housing slide lock 312A laterally in the x direction. The heat sink 400 may then be slid forward in the z direction such that the leading end 414 of the first heat sink slide lock 408A passes the leading end 320 of the first housing slide lock 312A and comes to a stop at the trailing end 318 of the first housing slide lock 312A, e.g., due to the housing hard stop 316 stopping further forward motion of the first heat sink slide lock 408A. The relative arrangement and orientation of all of the heat sink slide locks 408 with respect to the housing slide locks 312 during the installation process and when fully installed may be similar to that described for the first heat sink slide lock 408A and the first housing slide lock 312A in the context of FIG. 6A.

As previously mentioned, contours of the bottoms 314 of the housing slide locks 312 and of the tops 412 of the heat sink slide locks 408 may be complementary to, e.g. provide tactile feedback when the heat sink slide locks 408 fully engage the housing slide locks 312 and/or to bias the heat sink 400 at a particular position with respect to the module 300. For example, as illustrated in FIG. 6A, the contour of the bottom 314 of the first housing slide lock 312A may include a convex contour and the contour of the top 412 of the first heat sink slide lock 408A may include a concave contour which may generally be complementary to the convex contour of the first housing slide lock 312A. One or more of the other housing slide locks 312 and of the other heat sink slide locks 408 may be similarly configured. Each pair of a housing slide lock 312 with a convex contour and a corresponding heat sink slide lock 408 with a concave contour may collectively form a locking detent between the module 300 (or more particularly the housing 302) and the heat sink 400.

Although not illustrated, alternatively, the contour of the bottom 314 of the first housing slide lock 312A may include a concave contour and the contour of the top 412 of the first heat sink slide lock 408A may include a convex contour which may generally be complementary to the concave contour of the first housing slide lock 312A. One or more of the other housing slide locks 312 and of the other heat sink slide locks 408 may be similarly configured. Each pair of a housing slide lock 312 with a concave contour and a corresponding heat sink slide lock 408 with a convex contour may collectively form a locking detent between the module 300 (or more particularly the housing 302) and the heat sink 400.

Figure 6B:
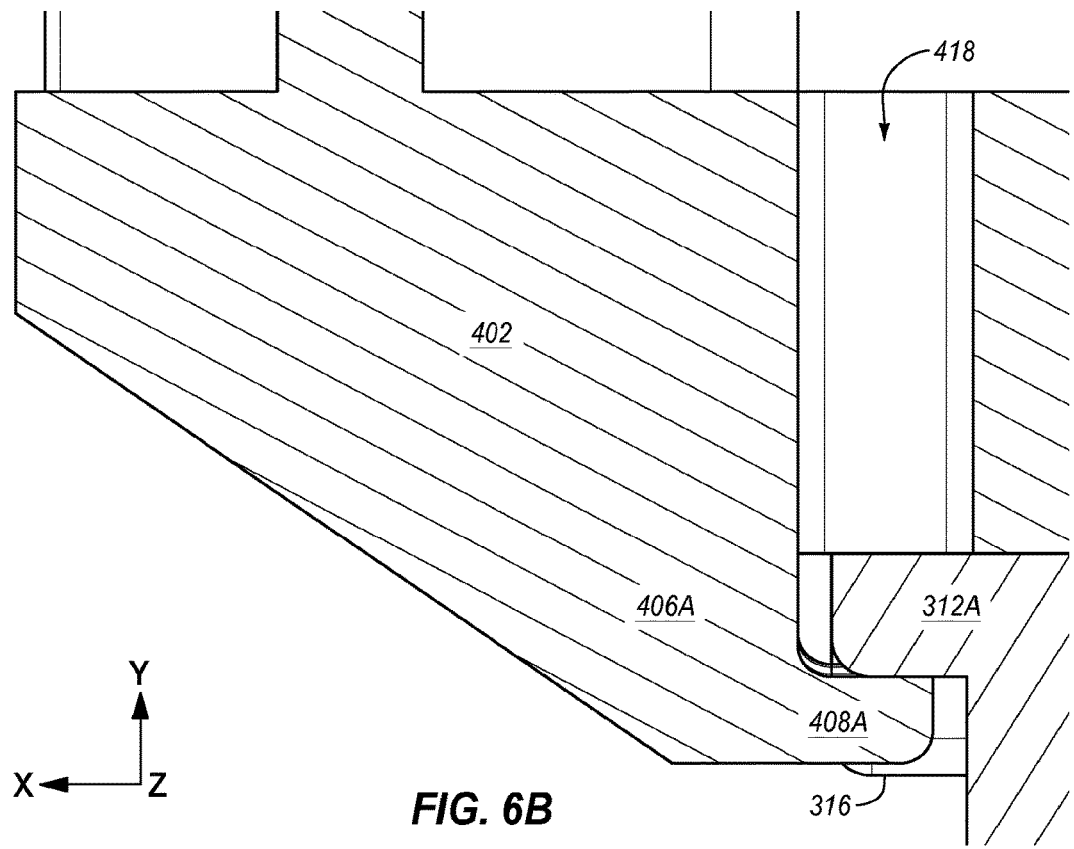
FIG. 6B is a detail cross-sectional rear view of the first heat sink slide lock and the first housing slide lock of FIGS. 2A-4B.

FIG. 6B is a detail cross-sectional rear view of the first heat sink slide lock 408A and the first housing slide lock 312A, arranged in accordance with at least one implementation described herein. The cross-section of FIG. 6B has been taken along a cutting plane parallel to the x-y plane and looking in the positive z direction.

Figure 7:
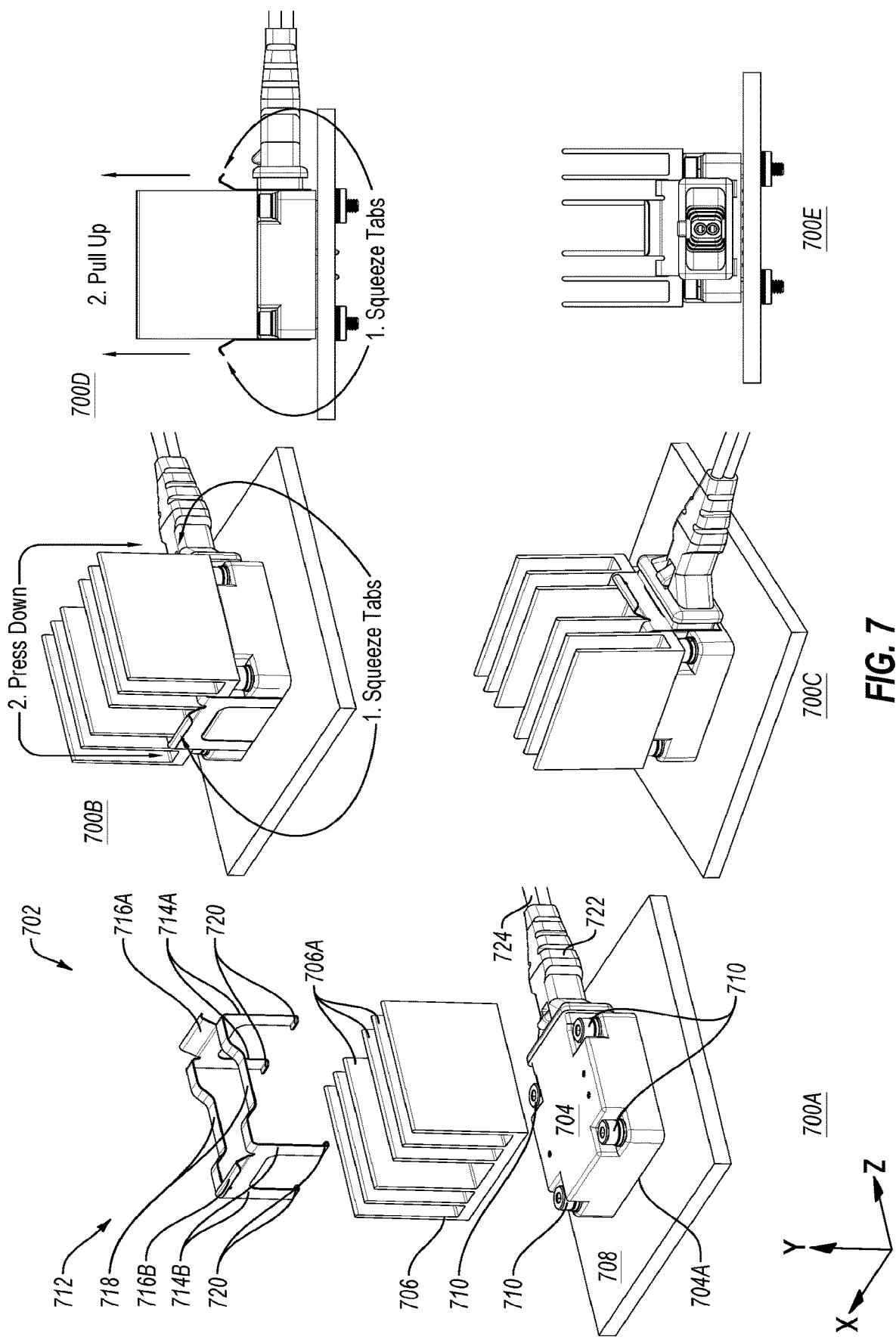
FIG. 7 illustrates an exploded top perspective view of another example optoelectronic system.

FIG. 7 illustrates an exploded top perspective view 700A of another example optoelectronic system 702 (hereinafter "system 702"), arranged in accordance with at least one implementation described herein. The system 702 is an implementation of the system 100 of FIG. 1. The system 702 includes at least an optoelectronic module 704 (hereinafter "module 704") and a heat sink 706. The system 702 may additionally include a host PCB 708 and one or more screws 710 or other fasteners to secure the module 704 to the host PCB 708. The module 704, the heat sink 706, and the host PCB 708 are implementations of the module 106, the heat sink 104, and the host PCB 102 of FIG. 1 and the description of the module 106, the heat sink 104, and the host PCB 102 applies to the module 704, the heat sink 706, and the host PCB 708.

The module 704 may generally be similar to the module 300, except that the housing slide locks 312 may be omitted from the module 704.

The heat sink 706 may generally be similar to the heat sink 400, except that the heat sink slide locks 408 and the heat sink legs 406 may be omitted from the heat sink 706. In addition, heat sink fins 706A of the heat sink 706 may be aligned parallel to the z axis, as compared to the diagonally-aligned heat sink fins 404 of the heat sink 400 and may be spaced to accommodate a retention clip 712.

In the absence of the housing slide locks 312 and the heat sink slide locks 408, the heat sink 706 may be secured to the top of the module 704 by the retention clip 712 included in the system 702. In these and other embodiments, the heat sink 706 may be lowered vertically onto the top of the module 704 followed by installation of the clip 712 to secure the heat sink 706 to the top of the module 704 to minimize an assembly envelope of the heat sink 706. In the example of FIG. 7, there is no need to slide the heat sink 706 relative to the module 704 in the z direction or the x direction during installation, thereby minimizing the assembly envelope. In some implementations, the assembly envelope for the implementation of FIG. 7 may be zero since the heat sink 706 and the clip 712 may be installed on the module 704 without sliding the heat sink 706 relative to the module 704.

The retention clip 712 includes front legs 714A, rear legs 714B (collectively "legs 714"), front tab 716A, rear tab 716B (collectively "tabs 716") and cross springs 718 coupled between the front legs 714A and the rear legs 714B. Each of the legs 714 includes a corresponding foot 720.

FIG. 7 additionally includes views 700B-700E showing the heat sink 706 installed on the module 704 using the retention clip 712. The xyz coordinate system included in the top left of FIG. 7 only applies to the views 700A and 700B and xyz coordinate systems for the views 700C-700E have been omitted for simplicity. Further, the various components of the system 702 of FIG. 7 are only labeled in the view 700A for simplicity.

The retention clip 712 may include a resilient or semi-resilient material, such as sheet metal or other suitable material. As such, the retention clip 712 or its various components may be configured to flex or otherwise resiliently deform.

With reference to the view 700B, to install the retention clip 712 and secure the heat sink 706 to the module 704, the heat sink 706 is first lowered onto the top of the module 704 with the heat sink fins 706A aligned in the z direction. The tabs 716 of the retention clip 712 may then be squeezed together to temporarily widen a distance between the feet 720 of the front legs 714A and the feet 720 of the rear legs 714B. The retention clip 712 may be aligned in the x direction so that the cross springs 718 are each aligned in the x direction between adjacent heat sink fins 706A. With the tabs 716 squeezed together and the cross springs 718 thus aligned, the retention clip 712 may be lowered to the position illustrated in the view 700B until the cross springs 718 rest on an upper surface of the heat sink 706.

At this point, the feet 720 of the retention clip 712 may be near, but not quite beneath, a bottom surface 704A of the module 704 and the legs 714 may be at least slightly outwardly flexed if a length of the module 704 is greater than the uninstalled distance between the feet 720 of the front legs 714A and the feet 720 of the rear legs 714B when the tabs 716 are not squeezed together. Accordingly, the tabs 716 may be pushed downward to cause (1) the cross springs 718 to flex, and (2) the feet 720 to clear the bottom surface 704A of the module 704 and move inward to engage the bottom surface 704A of the module 704. With the cross springs 718 flexed sufficiently to allow the feet 720 to clear the bottom surface 704A of the module 704, the cross springs 718 may urge the heat sink 706 downward against the top surface of the module 704 for good thermal contact between the heat sink 706 and the module 704. Optionally, a thermal pad, thermal grease, thermal gel, thermal tape, thermal paste or other thermally conductive material or substance may be disposed between a heat sink bottom of the heat sink 706 and the top surface of the module 704.

With reference to the view 700D, the retention clip 712 may be uninstalled by squeezing the tabs 716 together at least until the feet 720 of the front legs 714A clear a front surface of the module 704 and the feet 720 of the rear legs 714B clear a rear surface of the module 704, allowing the retention clip 712 to be pulled up and removed from the module 704 and the heat sink 706.

The views 700C and 700E illustrate how the front legs 714A of the retention clip 712 straddle a plug 722 (labeled in view 700A only) that terminates an optical fiber 724 (labeled in view 700A only) inserted into a receptacle of the module 704. The position of each of the cross springs 718 between heat sink fins 706A of the heat sink 706 can also be seen in the view 700E.

The retention clip 712 may be symmetric, e.g., a front half of the retention clip 712 that includes the front legs 714A and the front tab 716A may be identical or substantially identical to a back half of the retention clip 712 that includes the rear legs 714B and the rear tab 716B. Other retention clips according to some embodiments may be asymmetric, as illustrated in FIG. 8.

Figure 8:
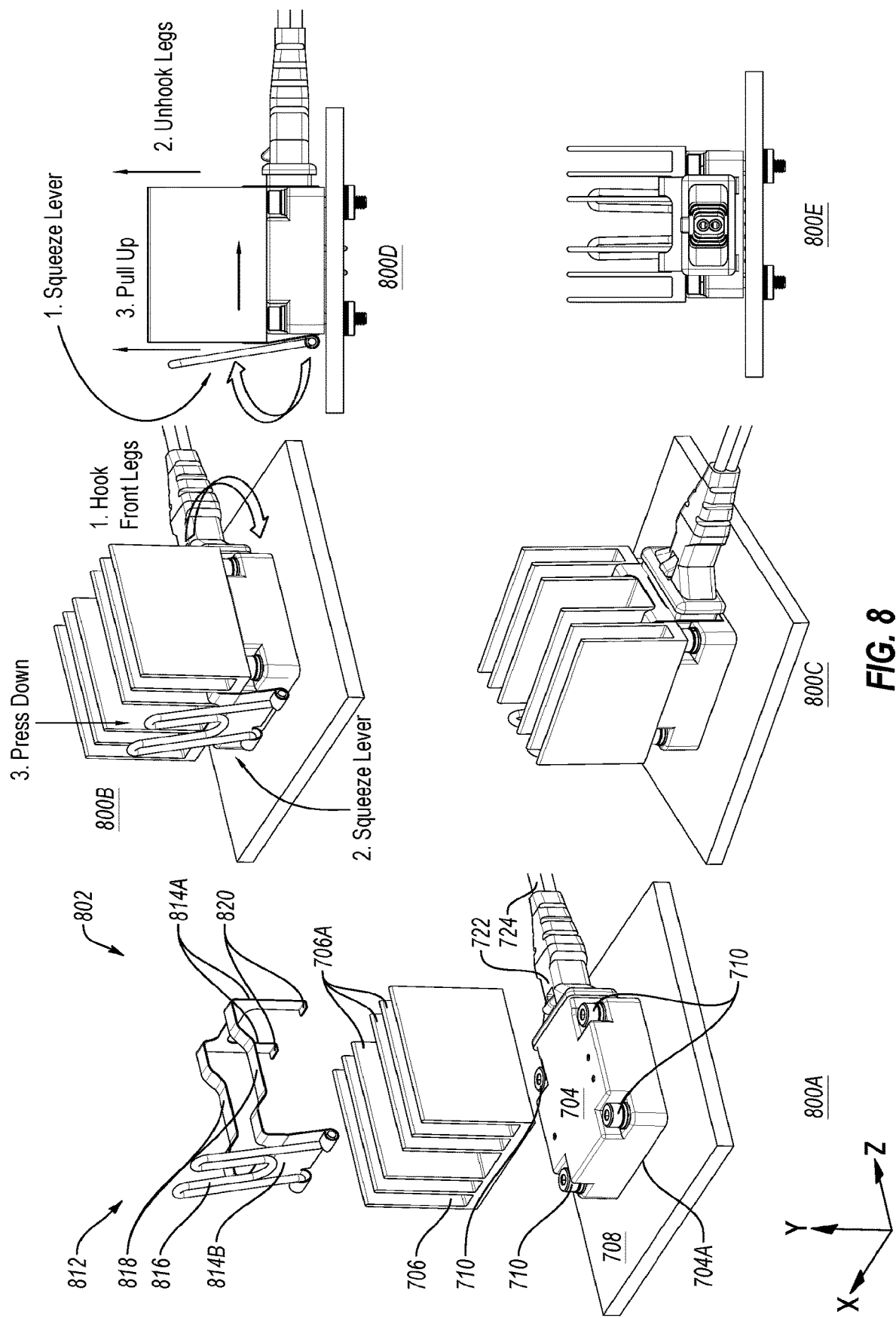
FIG. 8 illustrates an exploded top perspective view of another example optoelectronic system.

FIG. 8 illustrates an exploded top perspective view 800A of another example optoelectronic system 802 (hereinafter "system 802"), arranged in accordance with at least one embodiment described herein. The system 802 may include all of the components of the system 702 except for the retention clip 712. Instead, the system 802 may include a retention clip 812 that is asymmetric.

The retention clip 812 includes front legs 814A, rear leg 814B (collectively "legs 814"), and cross springs 818 coupled between the front legs 814A and the rear legs 814B. Each of the front legs 814A includes a corresponding foot 820. Instead of tabs 716, the retention clip 812 includes a lever 816 coupled to the rear leg 814B.

FIG. 8 additionally includes views 800B-800E showing the heat sink 706 installed on the module 704 using the retention clip 812. The xyz coordinate system included in the top left of FIG. 8 only applies to the views 800A and 800B and xyz coordinate systems for the views 800C-800E have been omitted for simplicity. Further, the various components of the system 802 of FIG. 8 are only labeled in the view 800A for simplicity.

The retention clip 812 may include a resilient or semi-resilient material, such as sheet metal or other suitable material. As such, the retention clip 812 or its various components may be configured to flex or otherwise resiliently deform.

With reference to the view 800B, to install the retention clip 812 and secure the heat sink 706 to the module 704, the heat sink 706 is first lowered onto the top of the module 704 with the heat sink fins 706A aligned in the z direction. The retention clip 812 may be aligned in the x direction so that the cross springs 818 are each aligned in the x direction between adjacent heat sink fins 706A. A front half of the retention clip 812, including the front legs 814A, may then be lowered until the feet 720 of the front legs 814A hook the bottom surface 704A of the module 704. With the front half of the retention clip 812 hooked to the module 704, the lever 816 may be squeezed to widen a distance between the rear leg 814B and the front legs 814A so that a rear half of the retention clip 812 may be lowered until the cross springs 818 are resting on the upper surface of the heat sink 706.

The lever 816 may then be pressed down to cause the cross springs 818 to flex and a bottom of the rear leg 814B to clear and engage the bottom surface 704A of the module 704. With the cross springs 818 flexed in the final installed position of the retention clip 812, the cross springs 818 may urge the heat sink 706 downward against the top surface of the module 704 for good thermal contact between the heat sink 706 and the module 704. Optionally, a thermal pad, thermal grease, thermal gel, thermal tape, thermal paste or other thermally conductive material or substance may be disposed between a heat sink bottom of the heat sink 706 and the top surface of the module 704.

In the example of FIG. 8, there is no need to slide the heat sink 706 relative to the module 704 in the z direction or the x direction during installation, thereby minimizing the assembly envelope. In some implementations, the assembly envelope for the implementation of FIG. 8 may be zero since the heat sink 706 and the clip 812 may be installed on the module 704 without sliding the heat sink 706 relative to the module 704.

With reference to the view 800D, the retention clip 812 may be uninstalled by squeezing the lever 816 to unhook the rear leg 814B, rotating the back half of the retention clip 812 upward, unhooking the feet 820 of the front legs 814A, and then pulling the retention clip 812 upward.

The views 800C and 800E illustrate how the front legs 814A of the retention clip 812 straddle the plug 722 (labeled in view 800A only) that terminates the optical fiber 724 (labeled in view 800A only) inserted into the receptacle of the module 704. The position of each of the cross springs 818 between heat sink fins 706A of the heat sink 706 can also be seen in the view 800E.

Figure 9:
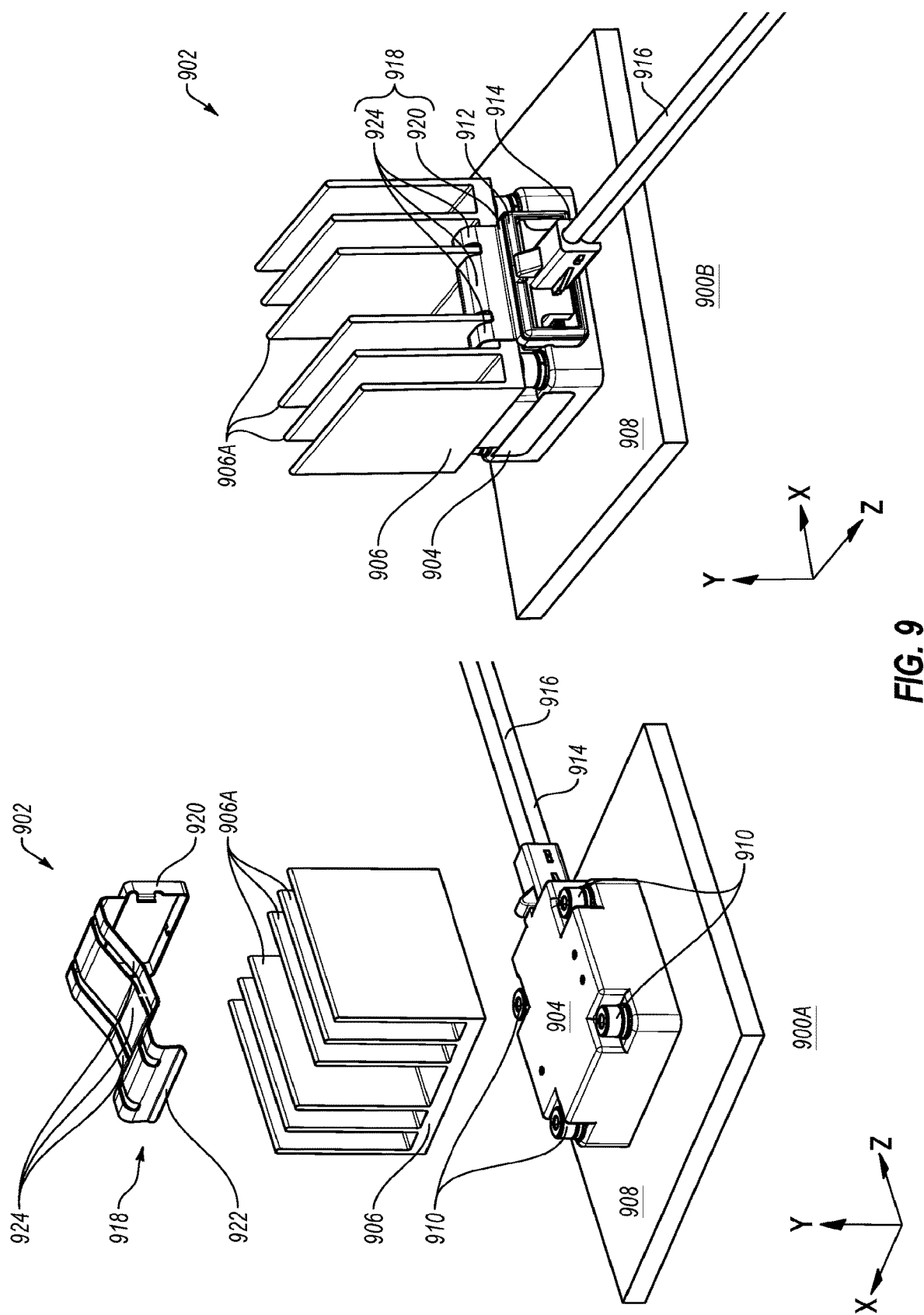
FIG. 9 illustrates an exploded top rear perspective view and a top front perspective view of another example optoelectronic system.

FIG. 9 illustrates an exploded top rear perspective view 900A and a top front perspective view 900B of another example optoelectronic system 902 (hereinafter "system 902"), arranged in accordance with at least one embodiment described herein. The system 902 is an implementation of the system 100 of FIG. 1. The system 902 includes at least an optoelectronic module 904 (hereinafter "module 904") and a heat sink 906. The system 902 may additionally include a host PCB 908 and one or more screws 910 or other fasteners to secure the module 904 to the host PCB 908. The module 904, the heat sink 906, and the host PCB 908 are implementations of the module 106, the heat sink 104, and the host PCB 102 of FIG. 1 and the description of the module 106, the heat sink 104, and the host PCB 102 applies to the module 904, the heat sink 906, and the host PCB 908.

The module 904 may generally be similar to the module 300, except that the housing slide locks 312 may be omitted from the module 904. In addition, the module 904 includes a neck 912 (view 900B) that extends forward (e.g., in the positive z direction) from a fiber side surface of the module 904. The neck 912 defines a receptacle configured to receive a plug 914 that terminates an optical fiber 916. The plug 914 may be or include a fiber connector, such as an MT connector.

The heat sink 906 may generally be similar to the heat sink 400, except that the heat sink slide locks 408 and the heat sink legs 406 may be omitted from the heat sink 906. In addition, heat sink fins 906A of the heat sink 906 may be aligned parallel to the z axis, as compared to the diagonally-aligned heat sink fins 404 of the heat sink 400, and may be spaced to accommodate a cantilever retention clip 918.

In the absence of the housing slide locks 312 and the heat sink slide locks 408, the heat sink 906 may be secured to the top of the module 904 by the cantilever retention clip 918 included in the system 902. The cantilever retention clip 918 includes a collar 920, a lip 922, and one or more cross springs 924 that extend between the collar 920 and the lip 922. The cross springs 924 are spaced apart by gaps to accommodate corresponding fins 906A of the heat sink 906 such that each of the cross springs 924 is configured to be received between a different pair of the fins 906A. The cantilever retention clip 918 may include a resilient or semi-resilient material, such as sheet metal or other suitable material. As such, the cantilever retention clip 918 or its various components may be configured to flex or otherwise resiliently deform.

The embodiment of FIG. 9 requires installation of the heat sink 906 and the cantilever retention clip 918 prior to insertion of the plug 912 into the receptacle defined by the neck 912 of the module 904, as well as removal of the plug 912 from the receptacle prior to removal of the heat sink 906 and the cantilever retention clip 918 from the module 904. In particular, when the plug 912 is unplugged from the receptacle, the cantilever retention clip 912 may be pre-assembled with the heat sink 906 by lowering the cantilever retention clip 912 relative to the heat sink 906 such that each of the two middle-most fins 906A of the heat sink 906 is received within a corresponding one of the two gaps between the cross springs 924 of the cantilever retention clip. The cantilever retention clip 912 may be lowered relative to the heat sink 906 at least until a bottom edge (or more) of the lip 920 of the cantilever retention clip 912 clears a lower surface of the heat sink 906. With the collar 920 of the cantilever retention clip 918 forward of the neck 912 of the module 904, the thus pre-assembled cantilever retention clip 918 and heat sink 906 (hereinafter "pre-assembled clip/heat sink 918/906") may be lowered to at least partially rest on a top surface of the module 904. The pre-assembled clip/heat sink 918/906 may be pressed downward onto the top surface of the module 904, causing the cross springs 924 to flex in the process, until the collar 920 is aligned in the y direction with the neck 912 of the module 904. From here, the pre-assembled clip/heat sink 918/906 may be slid backward relative to the module 904 to receive the neck 912 within the collar 920. The pre-assembled clip/heat sink 918/906 may be slid backward relative to the module 904 until the collar 920 reaches the fiber side surface of the module 904 from which the neck 912 extends. In the example of FIG. 9, the assembly envelope may be equal to a distance of backward slide of the pre-assembled clip/heat sink 918/906 relative to the module 904, which in some embodiments may be equal to or less than a distance in the z direction that the neck 912 extends forward from the fiber side surface of the module 904.

In some embodiments, the cross-springs 924 may be flexed when the cantilever retention clip 918 and heat sink 906 installed on the module 904. With the cross springs 924 flexed, the cross springs 924 may urge the heat sink 906 downward against the top surface of the module 904 for good thermal contact between the heat sink 906 and the module 904. Optionally, a thermal pad, thermal grease, thermal gel, thermal tape, thermal paste or other thermally conductive material or substance may be disposed between a heat sink bottom of the heat sink 906 and the top surface of the module 904.

Following installation of the cantilever retention clip 918 and the heat sink 906, the plug 914 may be inserted into the receptacle defined by the neck 912 of the module 904 to optically couple the optical fiber 916 to one or more components (e.g., optical transmitter, optical receiver) of the module 904. The cantilever retention clip 918 and the heat sink 906 may be removed from the module 904 by first removing the plug 914 from the receptacle and reversing the cantilever retention clip 918 and heat sink 906 installation process.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described implementations are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A cantilever retention clip to removably secure a heat sink to an optoelectronic module, the cantilever retention clip comprising:
   one or more cross springs configured to be received between a pair of fins of the heat sink, each of the one or more cross springs having a front end and a rear end opposite the front end;
   a first projection that extends downward from the front end of the one or more cross springs and that is configured to be positioned proximate to a fiber side of the optoelectronic module when the heat sink is removably secured to the optoelectronic module by the cantilever retention clip, the first projection coupling the cantilever retention clip to the optoelectronic module; and
   a second projection that extends downward from the rear end of the one or more cross springs and that is configured to be positioned proximate to a rear side of the optoelectronic module opposite the fiber side of the optoelectronic module when the heat sink is removably secured to the optoelectronic module by the cantilever retention clip, the second projection not coupling the cantilever retention clip to the optoelectronic module;
   wherein at least one of the first projection or the second projection is configured to selectively engage the optoelectronic module to removably secure the heat sink to the optoelectronic module.

2. The cantilever retention clip of claim 1, wherein the first projection comprises a collar configured to receive a neck of the optoelectronic module and wherein the second projection comprises a lip configured to extend below a bottom surface of the heat sink when the heat sink is removably secured to the optoelectronic module by the cantilever retention clip.

3. The cantilever retention clip of claim 1, wherein the one or more cross springs comprise a plurality of cross springs, each of the plurality of cross springs configured to be received between a different pair of fins of the heat sink.

4. The cantilever retention clip of claim 1, wherein the first projection comprises two front legs that each includes a foot that extends rearward from a bottom of the corresponding front leg and wherein the second projection comprises at least one rear leg.

5. An optoelectronic system, comprising:
   an optoelectronic module;
   a heat sink comprising a plurality of fins; and
   retention clip that removably secures the heat sink to the optoelectronic module, the retention clip comprising:
      two cross springs, each positioned between a different pair of fins of the heat sink;
      two front legs that extend downward from a front of the two cross springs proximate a fiber side of the optoelectronic module when the heat sink is removably secured to the optoelectronic module, each of the two front legs including a foot that extends rearward; and
      at least one rear leg that extends downward from a rear of the two cross springs proximate to a rear side of the optoelectronic module opposite the fiber side of the optoelectronic module when the heat sink is removably secured to the optoelectronic module by the retention clip.

6. The optoelectronic system of claim 5, wherein:
   the fiber side of the optoelectronic module includes a receptacle with a plug received therein, the plug terminating an optical fiber;
   the two front legs are separated by a gap;
   at least a portion of the plug is positioned within the gap;
   a first one of the two front legs is laterally positioned to a first side of the plug; and
   a second one of the two front legs is laterally positioned to a second side of the plug, the second side opposite the first side.

7. The optoelectronic system of claim 5, wherein the at least one rear leg comprises two rear legs that each includes a foot that extends frontward.

8. The optoelectronic system of claim 7, wherein the foot of each of the front and rear legs is configured to engage a bottom surface of the optoelectronic module when the heat sink is removably secured to the optoelectronic module by the retention clip.

9. The optoelectronic system of claim 8, further comprising a front tab that extends upward from the front legs and a rear tab that extends upward from the rear legs, wherein a distance between the feet of the front legs and the feet of the rear legs is configured to increase in response to the front and rear tabs being squeezed toward each other.

10. The optoelectronic system of claim 5, wherein the at least one rear leg comprises a single rear leg, the retention clip further comprising a lever coupled to the single rear leg.

11. The optoelectronic system of claim 5, wherein a minimum translation distance in an optical fiber plugging direction to removably secure the heat sink to the optoelectronic module using the retention clip is zero.

12. The optoelectronic system of claim 5, wherein when the heat sink is removably secured to the optoelectronic module by the retention clip, the cross springs urge the heat sink downward against the optoelectronic module.

13. The optoelectronic system of claim 5, wherein each of the two front legs is configured to flex forwardly and each of the at least one rear leg is configured to flex rearwardly in response to installation of the retention clip on the optoelectronic module.

14. The optoelectronic system of claim 5, wherein an uninstalled lengthwise distance between a portion of the two front legs and a portion of the at least one rear leg is less than a length of the optoelectronic module and wherein the two front legs and the at least one rear leg are configured to flex outwardly in response to installation of the retention clip on the optoelectronic module.

15. The optoelectronic system of claim 5, wherein each of the two cross springs is substantially u-shaped when viewed from the side and is configured to flex and partially flatten in response to installation of the retention clip on the optoelectronic module.

16. A cantilever retention clip to removably secure a heat sink to an optoelectronic module, the cantilever retention clip comprising:
one or more cross springs, each of the one or more cross springs configured to be received between a different pair of fins of the heat sink;
a lip that extends downward from a first end of the one or more cross springs and with a bottom edge configured to extend below a bottom surface of the heat sink when the heat sink is removably secured to the optoelectronic module using the cantilever retention clip; and
a collar that extends downward from a second end of the one or more cross springs that is opposite the first end, wherein the collar is configured to receive therein a neck of the optoelectronic module that defines a receptacle to receive therein an optical fiber plug.

17. The cantilever retention clip of claim 16, wherein the neck of the optoelectronic module extends in an optical fiber plugging direction away from a fiber side surface of the optoelectronic module and wherein an assembly envelope in an optical fiber plugging direction to removably secure the heat sink to the optoelectronic module using the cantilever retention clip is less than or equal to a distance that the neck extends away from the fiber side surface.

18. The cantilever retention clip of claim 16, wherein when the heat sink is removably secured to the optoelectronic module by the cantilever retention clip, the cross springs are configured to urge the heat sink downward against the optoelectronic module.

19. The cantilever retention clip of claim 18, wherein the cross springs are configured to flex when the cantilever retention clip is installed on the optoelectronic module and to remain at least partially flexed when the heat sink is removably secured to the optoelectronic module by the retention clip to urge the heat sink against the optoelectronic module.

* * * * *